(12) United States Patent
Krautschneider et al.

(10) Patent No.: US 6,180,458 B1
(45) Date of Patent: Jan. 30, 2001

(54) METHOD OF PRODUCING A MEMORY CELL CONFIGURATION

(75) Inventors: Wolfgang Krautschneider, Hohenthann; Franz Hofmann; Wolfgang Roesner, both of Munich, all of (DE)

(73) Assignee: Infineon Technologies AG, Munich (DE)

( * ) Notice: Under 35 U.S.C. 154(b), the term of this patent shall be extended for 0 days.

(21) Appl. No.: 09/095,260

(22) Filed: Jun. 10, 1998

Related U.S. Application Data

(62) Division of application No. 08/794,566, filed on Feb. 3, 1997, now Pat. No. 5,821,591.

(30) Foreign Application Priority Data

Feb. 2, 1996 (DE) .............................................. 196 03 810

(51) Int. Cl.⁷ ................................................. H01L 21/336
(52) U.S. Cl. ........................ 438/259; 438/267; 438/268; 438/589
(58) Field of Search ................................. 438/268, 270, 438/589, 267, 259

(56) References Cited

U.S. PATENT DOCUMENTS

| | | |
|---|---|---|
| 4,954,854 | 9/1990 | Dhong et al. . |
| 5,306,941 | 4/1994 | Yoshida . |
| 5,492,858 * | 2/1996 | Bose et al. ............................. 437/67 |
| 5,670,803 | 9/1997 | Beilstein et al. . |
| 5,705,415 * | 1/1998 | Orlowski et al. ....................... 437/43 |
| 5,763,310 * | 6/1998 | Gardner ................................. 438/270 |
| 5,858,830 * | 1/1999 | Yoo et al. .............................. 438/241 |
| 5,882,969 * | 3/1999 | Krautschneider et al. ........... 438/259 |
| 5,888,868 * | 3/1999 | Yamazaki et al. .................... 438/258 |
| 5,891,773 * | 4/1999 | Saithoh ................................. 438/259 |
| 5,933,717 * | 8/1999 | Huase et al. .......................... 438/200 |
| 5,943,572 * | 8/1999 | Krautschneider ..................... 438/259 |

FOREIGN PATENT DOCUMENTS

| | | |
|---|---|---|
| 42 14 923 A1 | 12/1992 | (DE) . |
| 2-106966 | 4/1990 | (JP) . |
| 3-190165 | 8/1991 | (JP) . |
| 7-142610 | 6/1995 | (JP) . |

* cited by examiner

*Primary Examiner*—Richard Elms
*Assistant Examiner*—Michael S. Lebentratt
(74) *Attorney, Agent, or Firm*—Herbert L. Lerner; Laurence A. Greenberg; Werner H. Stemer

(57) ABSTRACT

A memory cell configuration includes first memory cells with planar MOS transistors and second memory cells with vertical MOS transistors. The planar MOS transistors are disposed on the bottom of and on the crown of parallel, strip-like trenches. The vertical MOS transistors are disposed on the side walls of the trenches. The memory cell configuration can be produced with a mean area requirement for each memory cell of 1 $F^2$, where F is the minimum structure size.

9 Claims, 6 Drawing Sheets

METHOD OF PRODUCING A MEMORY CELL CONFIGURATION

This application is a divisional application of application Ser. No. 08/794,566, filed Feb. 3, 1997, now U.S. Pat. No. 5,821,591.

BACKGROUND OF THE INVENTION

Field of the Invention

The invention pertains to memory cells and to the production of such memory cells.

In order to store large volumes of data, for example in data processing (DP) applications or for the digital storage of music or images, use is mainly made at present of memory systems which have mechanically moving parts such as, for example, hard disk storage, floppy disks or compact discs. The moved parts are subject to mechanical wear. Furthermore, they require a comparatively large volume and permit only slow data access. Moreover, since they are sensitive with regard to vibrations and positioning, and they have a comparatively high power consumption for their operation, these memory systems can be used in mobile systems only to a limited extent.

Relatively small volumes of data are usually in semiconductor-based read-only memories (ROM). These are often realized as planar, integrated silicon circuits in which MOS transistors are used as memory cells. The transistors are selected via the gate electrode which is connected to the word line. The input of the MOS transistor is connected to a reference line and the output is connected to a bit line. An assessment is made during the read operation, as to whether or not a current is flowing through the transistor. Logic values zero and one are assigned correspondingly. The storage of zero and one is effected in technical terms in that no MOS transistor is produced or no conductive connection to the bit line is realized in memory cells in which the logic value assigned to the state "no current flow through the transistor" is stored. As an alternative, MOS transistors which have different threshold voltages due to different implantation in the channel region can be realized for the two logic values.

The semiconductor-based memories permit random access to the stored information. The electrical power required to read the information is distinctly less than in the case of the above-mentioned memory systems which have mechanically moved parts. Since no moved parts are required, concerns with regard to mechanical wear and sensitivity to vibrations do not apply here. Semiconductor-based memories can therefore be used for mobile systems as well.

The above-mentioned silicon memories have a planar structure. A minimum area requirement thus becomes necessary for each memory cell and is 4 $F^2$ in the most favorable case, where F is the smallest structure size that can be produced with the respective technology.

The use of vertical MOS transistors in a read-only memory is disclosed in U.S. Pat. No. 4,954,854 to Dhong et al. The surface of a silicon substrate is provided with trenches, in that system, which are adjoined at the bottom by a source region, which are adjoined at the surface of the substrate by a drain region, and along whose sides a channel region is arranged. The surface of the trench is provided with a gate dielectric and the trench is filled with a gate electrode. Zero and one are differentiated in that configuration in that no trench is etched and no transistor is produced for one of the logic values.

A read-only memory cell configuration whose memory cells comprise MOS transistors is disclosed in German patent publication DE 42 14 923 A1. There, MOS transistors are arranged along trenches in such a way that a source region adjoins the bottom of the trench, a drain region adjoins the surface of the substrate, and a channel region adjoins at the side and bottom of the trench both vertically with respect to the surface of the substrate and parallel to the surface of the substrate. The surface of the channel region is provided with a gate dielectric. The gate electrode is designed as a spacer (edge cover). The logic values zero and one are differentiated by different threshold voltages, which are effected by channel implantation. During the channel implantation, the implanting ions impinge on the surface of the respective trench at such angles that implantation is deliberately effected only along one side due to shading effects of the opposite side.

SUMMARY OF THE INVENTION

It is accordingly an object of the invention to provide a memory cell configuration and a method for producing same, which overcomes the above-mentioned disadvantages of the heretofore-known devices and methods of this general type and which provides for a semiconductor-based memory cell configuration with increased storage density, which is suitable as a read-only memory for large volumes of data, and which can be produced with few production steps and at a high yield.

With the foregoing and other objects in view there is provided, in accordance with the invention, a memory cell configuration, comprising:

a semiconductor substrate having a main area and a multiplicity of memory cells disposed on said main area of said semiconductor substrate, each of the memory cells comprising at least one MOS transistor;

said memory cells including first memory cells formed as planar MOS transistors disposed in mutually parallel rows;

the semiconductor substrate having strip-like trenches with walls and a trench bottom formed therein which extend parallel to the mutually parallel rows;

the mutually parallel rows being disposed alternately on the trench bottom of the trenches and on the main area between mutually adjacent trenches; and the memory cells including second memory cells formed as MOS transistors, the MOS transistors of the second memory cells being vertical with respect to the main area and being formed on the side walls of the trenches.

In accordance with the invention there is also provided a method of producing a memory cell configuration. The method comprises the following steps:

etching a plurality of substantially parallel, strip-like trenches with a trench bottom and side walls into a main area of a semiconductor substrate;

forming planar MOS transistors on said trench bottoms and on the main area between adjacent trenches; and forming vertical MOS transistors on the side walls of the trenches.

The memory cell configuration according to the invention is realized in a semiconductor substrate. A semiconductor substrate is preferably used which has monocrystalline silicon at least in the main area. Both a monocrystalline silicon wafer and an SOI substrate are suitable as the semiconductor substrate.

The memory cell configuration has a multiplicity of memory cells which each comprise at least one MOS transistor. In this case, first memory cells comprise planar MOS transistors arranged in rows which run in parallel. Strip-like trenches which essentially run in parallel and run parallel to the rows are provided in the main area of the semiconductor substrate. The rows are arranged alternately on the bottom of the trenches and on the main area between adjacent trenches.

Second memory cells comprise MOS transistors which are vertical with respect to the main area and are each realized on the side walls of the trenches.

The first memory cells and the second memory cells differ with regard to the technological implementation of the MOS transistor. With regard to the storage capabilities, however, the first memory cells and the second memory cells are equivalent.

In accordance with the invention it is possible to program the memory cell configuration during the production of the memory cell configuration by producing the MOS transistors with different threshold voltages. This preferably takes place by means of masked channel implantation, in which the doping is deliberately changed in the channel region of the MOS transistors.

As an alternative, different threshold voltages of the MOS transistors are realized by virtue of the fact that the MOS transistors have gate dielectrics of different thickness depending on the stored information. In this case, use is made of the fact that when the thickness of the gate dielectrics differ by a factor of 10 or more, the threshold voltages of the MOS transistors differ from one another so distinctly that when a selection signal having a level between the two threshold voltages is applied, one MOS transistor conducts and the MOS transistor having the thicker gate dielectric does not conduct.

If the memory cell configuration is to be used for multi-value logic, then the MOS transistors have more than two different threshold voltages depending on the stored information.

It lies within the scope of the invention to provide for the MOS transistors a gate dielectric made of a material having traps. Traps have the property of capturing charge carriers, especially electrons. For the purpose of electrical programming, the MOS transistors are interconnected in such a way that charge carriers corresponding to the information to be stored pass into the gate dielectric and are retained by the traps.

This memory cell configuration is programmed after production by injecting electrons. This con be done both by Fowler-Nordheim tunneling and by hot electron injection. In order to store data in digital form, the MOS transistors are programmed in such a way that they have two different threshold voltages. If the memory cell configuration is to be used for multi-value logic, then the gate dielectric is exposed to different quantities of charge, by means of corresponding voltage and time conditions during programming, in such a way that the MOS transistors have more than two different threshold voltages depending on the stored information.

According to one embodiment of the invention, the gate dielectric is as a multiple layer in which a first layer has an increased charge carrier capture cross-section compared with a second layer in the multiple layer. The traps are localized at the interface between the two layers. The dielectric multiple layer preferably comprises an $SiO_2$ layer, an $Si_3N_4$ layer and an $SiO_2$ layer (so-called ONO) . As an alternative, the gate dielectric may be a multiple layer made of other materials, the layer having the increased charge carrier capture cross section consisting, for example, of $Si_3N_4$, $Ta_2O_5$, $Al_2O_3$ or $TiO_2$ and the adjacent layer of $SiO_2$, $Si_3N_4$ or $Al_2O_3$. In addition, the multiple layer can comprise more or fewer than two layers.

As an alternative, the gate dielectric can comprise a dielectric layer, made of $SiO_2$, for example, in which impurity atoms, for example W, Pt, Cr, Ni, Pd, Si or Ir, are included. The included impurity atoms can be introduced by implantation, by addition during oxidation or by diffusion. The included impurity atoms in this case form the traps.

Planar MOS transistors arranged in a row are preferably interconnected in series in the memory cell configuration according to the invention. Interconnected source/drain regions of planar MOS transistors which are adjacent along a row are in this case formed as a coherent, doped region. The two source/drain regions of each of the vertical MOS transistors are in each case formed as a coherent, doped region with one of the source/drain regions of one of the planar MOS transistor on the main area of the substrates and with one of the source/drain regions of the planar MOS transistors on the bottom of the trenches.

If, in this embodiment, the trenches are formed with a width F and a spacing F, F being the smallest structure size that can be produced with the respective technology, and if the dimension of the source/drain regions and of the channel region of the planar MOS transistors in the direction of the rows is in each case chosen to correspond to F, then s first memory cell having a planar MOS transistor and a second memory cell having a vertical MOS transistor are arranged on an area of 2 $F^2$. The mean area requirement for each memory cell is therefore 1. $F^2$. This increased packing density is achieved by virtue of the fact that the vertical MOS transistors are in each case arranged on the side walls of the trenches and require no additional area when projected onto the main area. The planar MOS transistors arranged along adjacent rows are insulated from one another by the channel region of the vertical MOS transistors arranged on the respective side wall.

According to one embodiment of the invention, a multiplicity of first word lines are provided which run transversely with respect to the trenches and are connected to gate electrodes of planar MOS transistors arranged along different rows. Furthermore, a multiplicity of second word lines are provided, which are each arranged in pairs in one of the trenches. In this case, the gate electrodes of vertical MOS transistors arranged along one of the side walls of the trenches are connected to one of the second word lines. An insulation structure, which suppresses the formation of conductive channels between adjacent MOS transistors, is provided between each two adjacent vertical MOS transistors which are arranged on the same side wall.

The insulation structures are preferably designed as a doped region in the respective side wall. The dopant concentration in the doped region is in this case so high that when a voltage is applied to the relevant word line, the parasitic MOS transistor formed between adjacent MOS transistors does not conduct. As an alternative, the insulation structures can also be formed as insulating spacers made of $SiO_2$, for example.

The memory cell configuration can be realized both using enhancement-mode MOS transistors and using depletion-mode MOS transistors. Negative drive voltages are required, however, in the case of depletion-mode MOS transistors with regard to effective leakage current suppression. When using enhancement-mode MOS transistors, effective leakage current suppression is obtained even when positive drive voltages are used.

The memory cell configuration according to the invention is preferably produced using self-aligning process stops, so that the space requirement for each memory cell is reduced.

In order to produce the memory cell configuration, strip-like trenches which run in parallel are etched in the main area of the semiconductor substrate. The vertical MOS transistors are formed in the side walls of the trenches, the planar MOS transistors are formed on the bottom of the trenches and between adjacent trenches on the main area.

First word lines running transversely with respect to the trenches are preferably formed. The first word lines act as a mask during a subsequent implantation for forming source/drain regions for the planar MOS transistors and for the vertical MOS transistors.

The second word lines are preferably formed as spacers made, for example, of doped polysilicon on the side walls of the trenches. For the purpose of insulation between the first word lines and the second word lines, the surface of the second word lines is covered with insulating material prior to the formation of the first word lines. This takes place, for example, by thermal oxidation of the surface, for example when forming a gate oxide, or by forming insulating spacers made, for example, of $SiO_2$. The use of insulating spacers for insulation between the first word lines and the second word lines has the advantage that the insulating spacers can be produced with a, greater thickness and independently of other process parameters such as, for example, the gate oxide thickness.

Other features which are considered as characteristic for the invention are set forth in the appended claims.

Although the invention is illustrated and described herein as embodied in method of producing a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
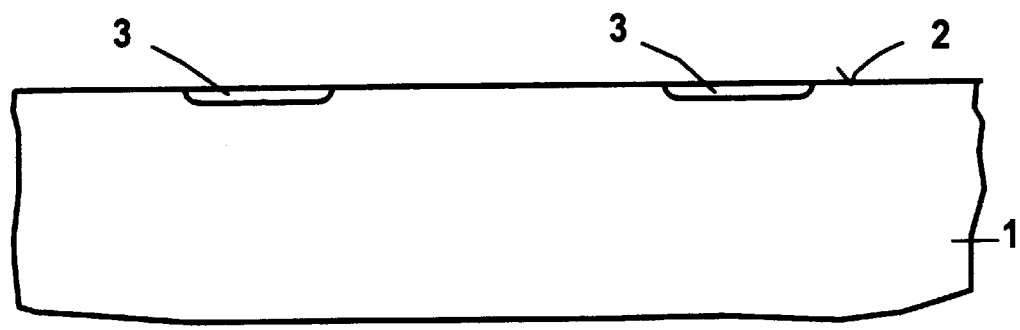
FIG. 1 is a partial side view of a substrate after a first channel implantation.

Referring now to the figures of the drawing in detail and first, particularly, to FIG. 1 thereof, there is seen a substrate 1 in which an insulation region is first produced. The substrate 1 is made, for example, of monocrystalline silicon. The insulation region, which defines a cell field for the non-illustrated memory cell configuration, is formed on a main area 2 of the substrate 1. The insulation region is formed, for example, by a LOCOS process .or an STI (Shallow Trench Isolation) process. The substrate 1 is preferably p-doped with a dopant concentration of $10^{15}$ $cm^{-3}$.

Figure 2:
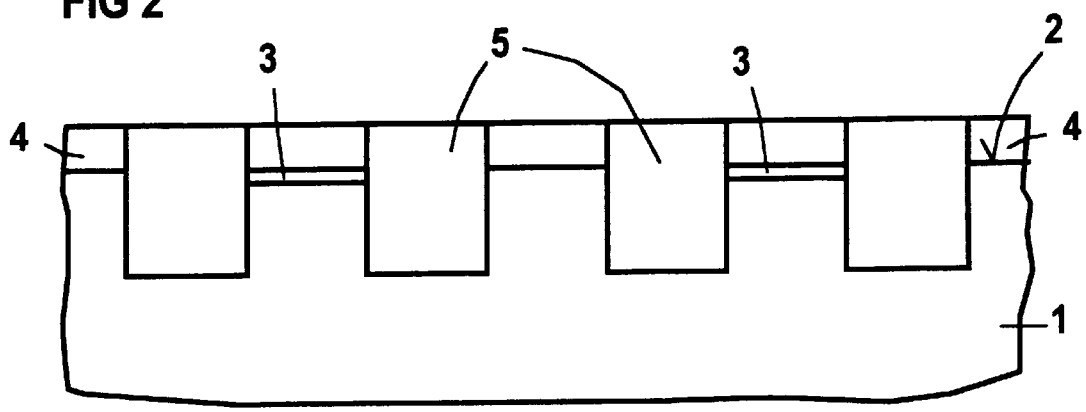
FIG. 2 is a similar view of the substrate after the etching of strip-like trenches.

Regions for depletion channels of MOS transistors are then defined with the aid of a photolithographic method. The depletion channels 3 are formed with the aid of a first channel implantation with arsenic at an energy of, for example, 40 keV and a dose of $4 \times 10^{13}$ $cm^{-2}$. The extent of the depletion channels 3 parallel to the main area 2 is 2F×2F; if a 0.4 $\mu$m technology is utilized, therefore, they are 0.8 $\mu$m ×0.8 $\mu$m (FIG. 2).

Again with reference to FIG. 2, a trench mask 4 is formed by the deposition of an $SiO_2$ layer to a thickness of, for instance, 100 nm to 200 nm with the aid of a TEOS method and subsequent structuring of the $SiO_2$ layer with the aid of a photolithographic process.

Strip-like trenches 5 are etched by means of anisotropic etching using $Cl_2$, for example, and using the trench mask 4 as an etching mask. The exemplary trenches 5 have a depth of 0.5 $\mu$m. The width of the trenches 5 is F (e.g. 0.4 $\mu$m), and the spacing between adjacent trenches 5 is likewise F (e.g. 0.4 $\mu$m). The length of the trenches 5 depends on the size of the memory cell configuration and is 130 $\mu$m, for example.

The width of the depletion channels 3 is set to the spacing between the trenches 5 during the etching of the trenches 5. The alignment of the trench mask 4 relative to the depletion channels 3 is therefore not critical.

Figure 3:
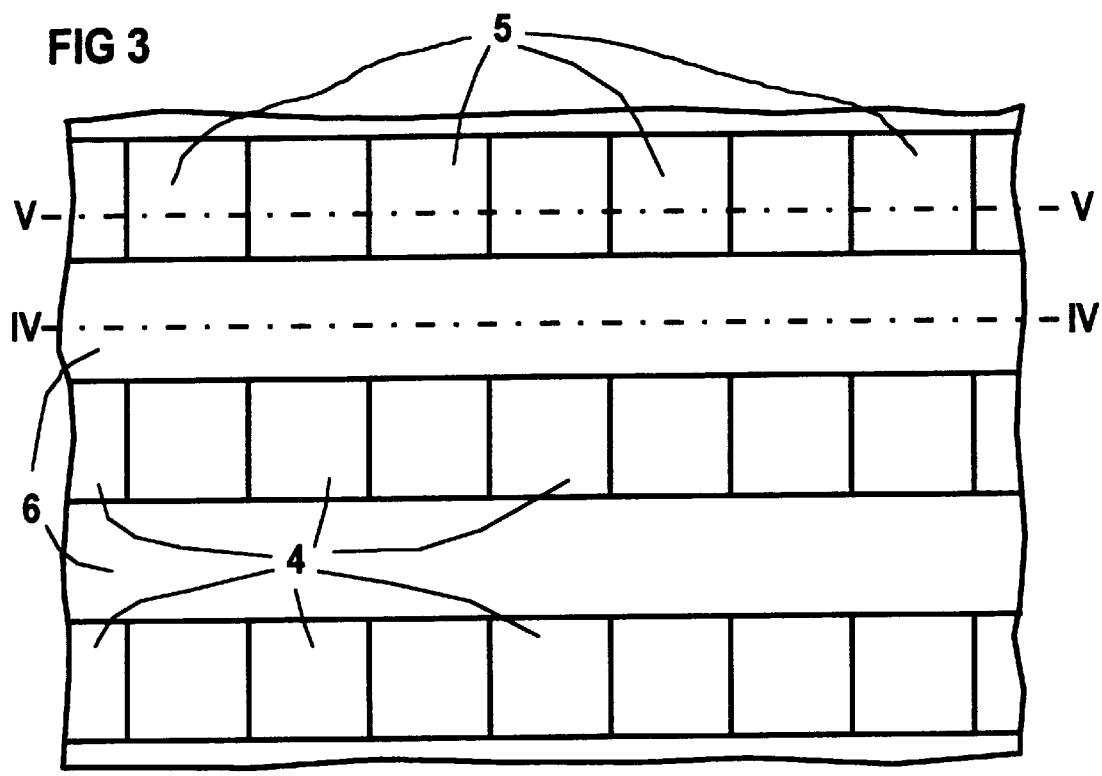
FIG. 3 is a plan view of the substrate after the formation of a first mask and the production of insulation structures in the side walls of the trenches.
Figure 4:
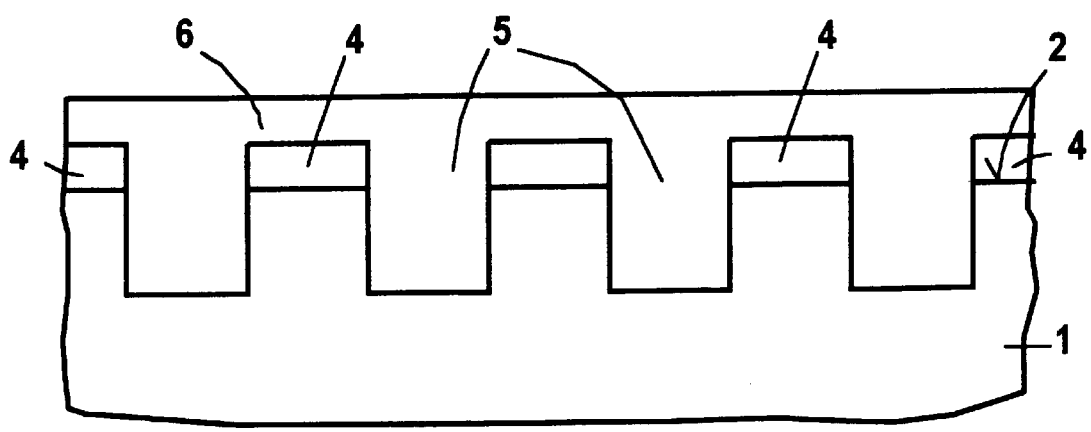
FIG. 4 is a sectional view through the substrate taken along the line IV—IV in FIG. 3.
Figure 5:
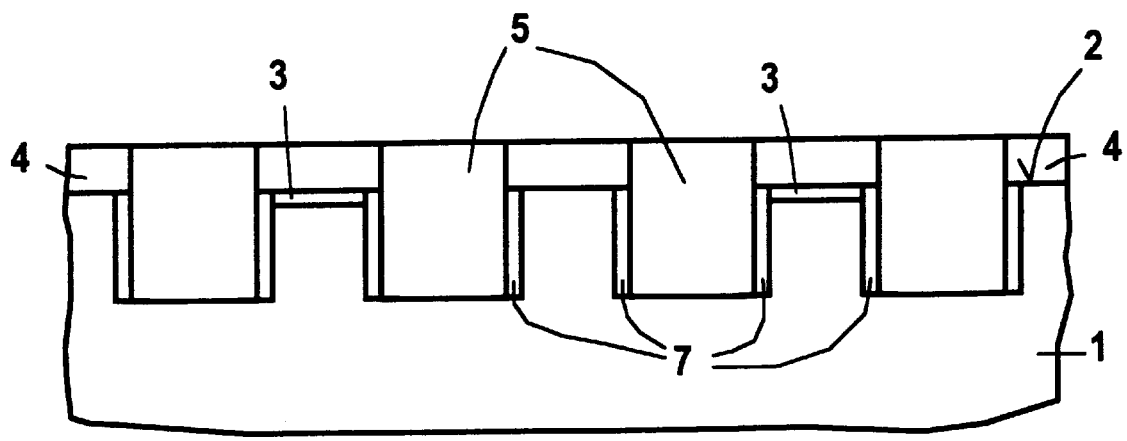
FIG. 5 is a sectional view through the substrate taken along the line V—V in FIG. 3, wherein the section corresponds to the section of FIG. 2.

A first resist mask 6 is subsequently formed with the aid of photolithographic process steps (see FIG. 2, FIG. 4, FIG. 5). The first resist mask 6 has strip-like openings which run perpendicular to the trenches 5 (see the plan view in FIG. 3). The width of the openings is F (e.g. 0.4 $\mu$m), and the spacing between adjacent openings is likewise F (e.g. 4 $\mu$m). Insulation structures 7 are produced in the region of the openings of the first resist mask 6, on the side wells of the trenches 5. The insulation structures 7 are formed, for example, by oblique implantation using boron ions. The angle during the ion implantation is chosen such that only the side walls lie within the implantation beam and the bottom of the trenches 5 is shaded. The implantation is in this case carried out from two sides, with the result that insulation structures 7 are formed on both side walls. The implantation takes place, for example, using boron ions at an angle of 15°, at an energy of, for example, 25 keV, and a dose of $10^{14}$ $cm^{-2}$.

As an alternative, the insulation structure 7 can be formed by out diffusion of spacers which are suitable as a diffusion source. The spacers are produced, for example, from boron-doped glass by the deposition of a boron-doped glass layer and anisotropic back etching on the side walls of the trenches 5. They are subsequently structured with the aid of a resist mask in such a way that they remain only on those regions of the side wall of which insulation structures 7 are to be formed. The resist mask used for structuring has strip-like openings which are complementary to the openings in the first resist mask 6.

In a further alternative, the insulation structures 7 can be formed as insulating spacers. For this purpose, for example using a TEOS method, a $SiO_2$ layer is deposited to a layer thickness of, for example, 30 to 80 nm and is anisotropically etched back. With the aid of a resist mask which is complementary to the first resist mask 6, the spacers are structured to form the insulation structures 7.

A non-illustrated second resist mask is formed after the removal of the first resist mask 6. A second channel implantation is carried out, in that case of which a higher threshold voltage is produced (not illustrated) by means of an inclined implantation of, for example, boron at an energy of 25 keV and a dose of, for example, $5 \times 10^{12}$ cm$^{-2}$ in the side walls of the trenches. The vertical MOS transistors are programmed in this process step.

Figure 6:
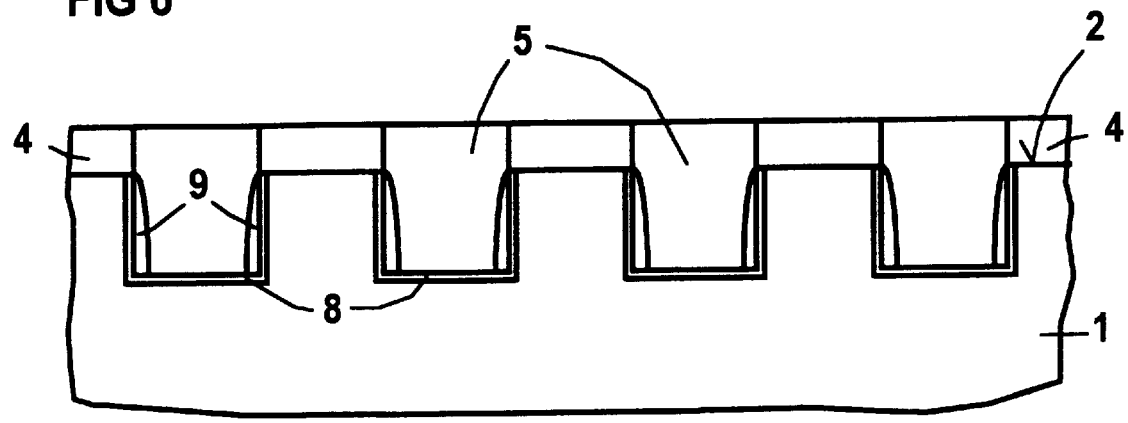
FIG. 6 is a sectional view similar to FIG. 4, after the formation of the gate dielectrics and gate electrodes for the vertical MOS transistors.

Following this, a gate dielectric 8 made, for example, of thermal $SiO_2$ is formed to a layer thickness of, for example, 5 to 10 nm on the side walls of the trenches 5 (see FIG. 6).

A doped polysilicon layer having conformal edge covering and a thickness of, for example, 50 nm is formed over the whole area. The doped polysilicon layer may be n$^+$-doped. It is produced by in situ-doped deposition or by undoped deposition and subsequent doping by diffusion or implantation. Doped polysilicon spacers 9 are formed on the side walls of the trenches 5 by anisotropic etching back of the doped polysilicon layer. This etching is carried out selectively with respect to the gate dielectric. The doped polysilicon spacers 9 run on the side walls of the trenches 5 over the entire length of the trenches 5 (see FIG. 6 and FIG. 7). In order to reduce the layer resistance of the doped polysilicon spacers 9, it is advantageous to provide them with a thin mental silicide layer. The metal silicide layer is formed, for example, by a reaction with tungsten. In this case, use is made of the fact that the tungsten silicide is formed only on the polysilicon, but not on the trench bottom and webs covered by gate dielectric.

A third channel implantation is carried out using a third resist mask (not illustrated). Depletion channels 10 are formed here at the bottom of the trenches 5. The third resist mask is subsequently removed again.

The trench mask 4 is subsequently removed by wetchemical etching, for example using hydrofluoric acid. Portions of the gate dielectric 8 which are situated on the bottom of the trenches 5 arc also removed at the same time. Insulating spacers 11 which completely cover the doped polysilicon spacers 9 are formed by whole-area deposition, for example using a TEOS method, and subsequent anisotropic etching back of an $SiO_2$ layer (see FIG. 7 and FIG. 8). The $SiO_2$ layer is deposited with a layer thickness of 30 to 80 nm, for example.

Following this, a further gate dielectric 12 made, for example, of thermal $SiO_2$ is formed. The further gate dielectric 12 is arranged on the bottom of the trenches 5 and on the main areas 2 between adjacent trenches 5. It has a layer thickness of 5 to 10 nm, for example.

A polysilicon layer and an $SiO_2$ layer are subsequently deposited. The polysilicon layer is, for example, deposited with in situ doping or is deposited with no doping and is subsequently doped by implantation or diffusion, for, from the vapor phase. The $SiO_2$ layer is deposited, for example, using a TEOS method. A hard mask (not illustrated) is formed from the $SiO_2$ layer with the aid of photolithographic methods. The doped polysilicon layer is structured using the hard mask as an etching mask. This produces first word lines 13 which run transversely with respect to the trenches 5 (see FIG. 7). The structuring of the first word lines 13 takes place in a highly selective manner with respect to the further gate dielectric 12. This structuring preferably takes place using a dry etching process with HBr and $Cl_2$.

The first word lines 13 are arranged in such a way that they each run above the insulation structures 7. The production of the first word lines 13 therefore necessitates alignment with regard to the insulation structures 7.

An implantation with arsenic at an energy of, for example, 80 keV and a dose of, for example, $5 \times 10^{15}$ cm$^{-2}$ is subsequently carried out, in which source/drain regions 14a are formed on the main area 2 and source/drain regions 14b are formed on the bottom of the trenches 5. The source/drain regions 14a, 14b each have a depth of 100 nm (see FIG. 8). The hard mask is removed after the formation of the source/drain regions 14a, 14b.

Each two source/drain regions 14a on the main area 2 and that part of the p-doped substrate 1 which adjoins the main area 2 in between, with or without a depletion channel 3, as well as the further gate dielectric 12 arranged thereabove and that part of the respective first word line 13 which is arranged thereabove form respective planar MOS transistor. Likewise, each two source/drain regions 14b arranged on the bottom of the trenches 5 as well as that part of the p-doped substrate 1 which is arranged in between at the bottom of the trench 5, with or without a depletion channel 10, as well as the further gate dielectric 12 arranged thereabove and that part of the respective first word line 13 which is arranged thereabove form a planar MOS transistor arranged at the bottom of the trench 5. Each two source/drain regions 14a, 14b adjoining a aide wall of the trench 5 as well as that part of the p-doped substrate 1 which adjoins the side wall is between, with or without a depletion channel, form a vertical MOS transistor with the adjoining part of the gate dielectric 8 and the doped polysilicon spacer 9. Adjacent planar MOS transistors which are arranged on the bottom of a trench 5 and on the main area are insulated from one another by the p-doped substrate 1. The doped polysilicon spacers 9 form second word lines via which the vertical MOS transistors are driven. The doped polysilicon spacers 9 are insulated from the first word lines 13 by the insulating spacers 30 11.

Figure 7:
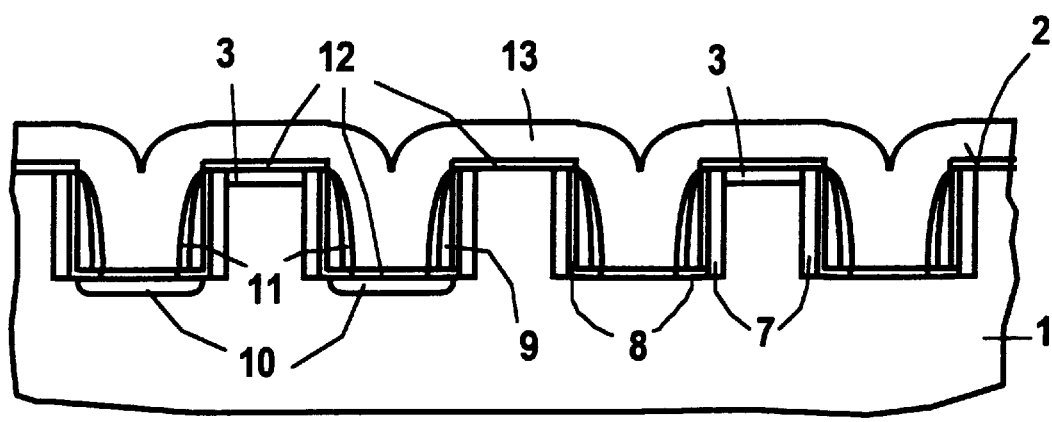
FIG. 7 is a sectional view similar to FIG. 5 (taken along the line VII—VII in FIG. 9), after the formation of insulating spacers covering the gate electrodes of the vertical MOS transistors, after the formation of the gate dielectrics for the planar MOS transistors, and after the formation of first word lines which run transversely with respect to the trenches.
Figure 8:
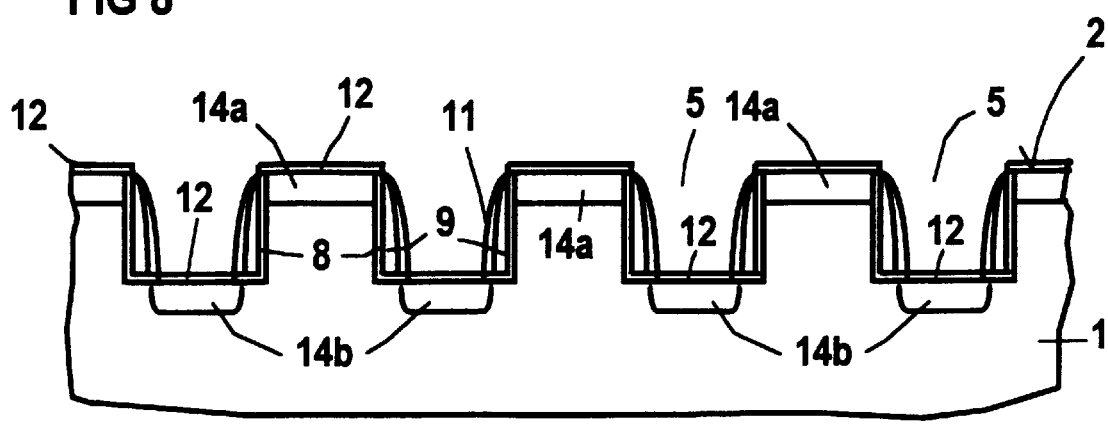
FIG. 8 is a sectional view similar to FIG. 6 (taken along the line VIII—VIII in FIG. 9), after the formation of source/drain regions.
Figure 9:
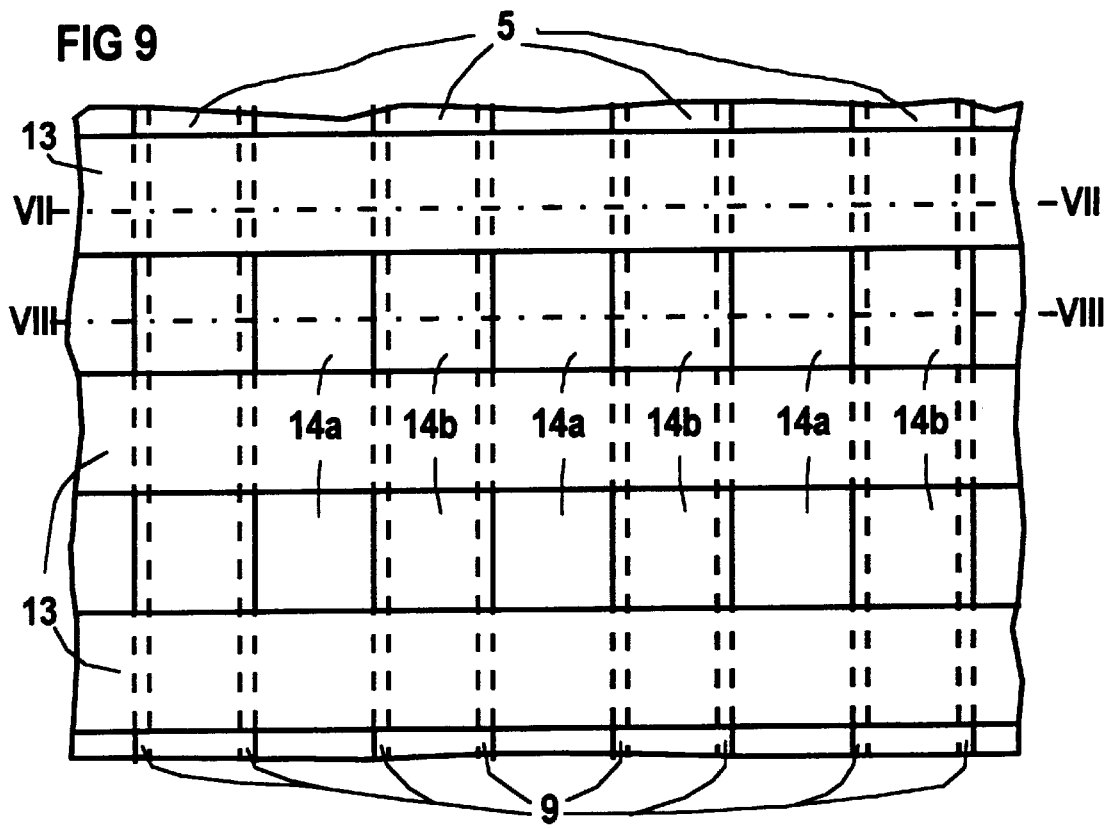
FIG. 9 is a further plan view of the substrate.

FIG. 9 illiterates a plan view of the sections illustrated in FIGS. 7 and 8. In this plan view, the position of the doped polysilicon spacers 9 has spacers depicted in the form of dashed lines. The first word lines 13 end the doped polysilicon spacers 9 which form the second word lines run perpendicular to one another.

In the exemplary embodiment, the source/drain regions 14a, 14b parallel to the main area 2 have dimensions of F×F. They are arranged directly next to one another (see FIG. 9). The spacing between adjacent source/drain regions 14n, 14b parallel to the trenches 5 is likewise F. Each source/drain region 14a, 14b belongs to two adjacent planar MOS transistors. The vertical MOS transistors are realized in the side walls of the trenches 5 and require no area parallel to the main area 2. Therefore, the area required by two memory cells, which comprise a planar MOS transistor and a vertical MOS transistor, is 2 $F^2$. The mean area requirement for each memory cell is therefore $F^2$.

Figure 10:
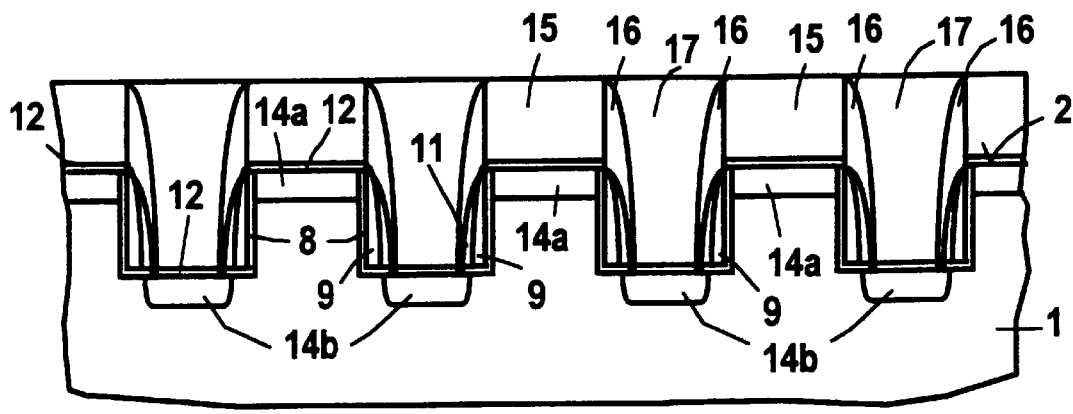
FIG. 10 is a sectional view through the substrate similar to FIG. 8, after the formation of bit line contacts on the source/drain regions at the bottom of the trenches.

In order to complete the memory cell configuration, an intermediate oxide layer 15 is produced over the whole area (see FIG. 10). The intermediate oxide layer 15 is formed with a layer thickness of, for example, 1600 nm. Contact holes are opened in the intermediate oxide layer to source/drain regions 14b situated at the bottom of the trenches 5. In order to avoid short circuits, the side walls of the contact holes are provided with insulating spacers 16. The insulating spacers 16 are formed, for example, by the deposition of an $SiO_2$ layer using a TEOS method to a layer thickness of, for example, 30 to 80 nm and anisotropic etching back of the $SiO_2$ layer. The spacers 16 cover those parts of the source/drain regions 14a situated on the main area 2 or of the word lines 13 which may possibly have bean exposed by etching on account of alignment errors. The contact holes are finally filled with metal fillings 17. For this purpose, a metal layer is applied, for example, by sputtering or vapor deposition and is structured with the aid of photolithographic process steps and an etching step. The metal fillings 17 are formed, for example, from aluminum or tungsten.

Figure 11:
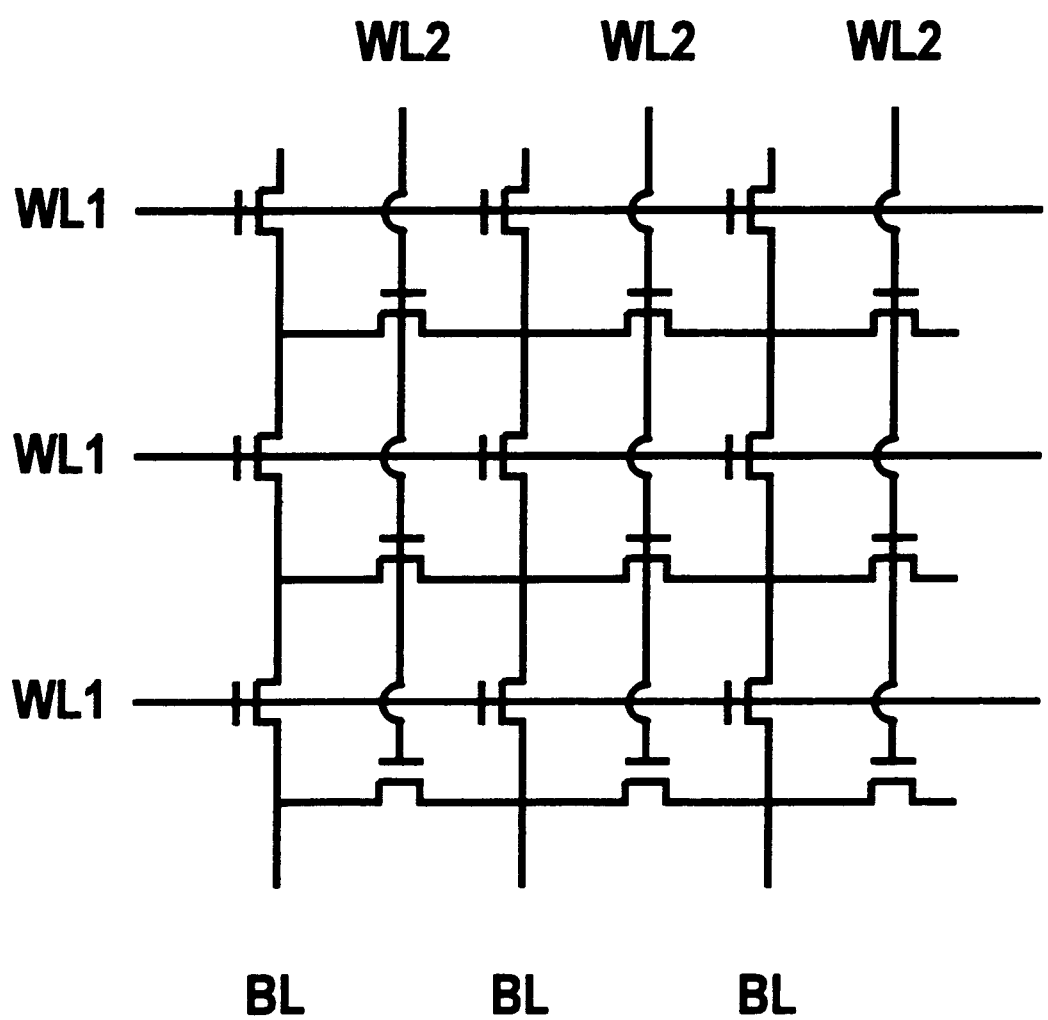
FIG. 11 is a circuit diagram showing a memory cell configuration with 3×3 memory cell pairs.

FIG. 11 illustrates a circuit diagram for a memory cell field having 3×3 memory cell pairs. The individual memory cells are arranged in a NAND configuration. The first word lines 13 are designated by WL1 and they each connect gate electrodes of planar MOS transistors to one another. The second word lines, which are formed by the doped polysilicon spacers 9, are designated by WL2 and they each connect gate electrodes of vertical. MOS transistors to one another. BL designates the bit lines which area realized by the planar MOS transistors which are each interconnected in series and are arranged on the main area 2 and on the bottom of the trenches 5. The assessment of the planar MOS transistors takes place via the bit lines BL and the respective first word lines WL1. The assessment of the vertical MOS transistors in each case takes place between an adjacent bit line BL of planar MOS transistors which are arranged on the main area 2 and the source/drain region 14b which is arranged on the bottom of the trench 5 and is put at a reference potential via the metal filling 17.

In the described embodiment of the invention, the memory cell configuration is programmed during the production of the memory cell configuration by the first channel implantation, the second channel implantation and the third channel implantation. The information stored here is introduced via the configuration of the openings in the resist masks used in the channel implantations.

The second channel implantation for programming the vertical MOS transistors can alternatively take place after the production of the first word lines 13. The second resist mask is in this case produced above the hard mask which is used to structure the first word lines 13. The openings overlap the hard mask, so that the alignment of the second resist mask parallel to the course of the trenches is non-critical. The depletion channels in the side walls of the trenches are formed in this case, too, by the oblique implantation of boron. The energy during the ion implantation is in this case set such that the boron ions pass through the doped polysilicon spacers 9 and the gate dielectric 8 into the side wall of the trenches 5. The implantation is carried out, for example, at an energy of 50 keV.

Different threshold voltages of the MOS transistors can also be realized during production by forming the gate dielectrics of the planar and/or vertical MOS transistors with different thicknesses.

In a further alternative, a material having traps is used as the gate dielectric 8 and as the further gate dielectric 12. The gate dielectric 8 and the further gate dielectric 12 are formed, for example, from a dielectric multiple layer in which at least one layer is provided which has an incensed charge carrier capture cross-section compared with at least one further layer in the multiple layer. The dielectric multiple layer preferably comprises an $SiO_2$ layer, an $Si_3N_4$ layer and an $SiO_2$ layer (so-called ONO). The layer thicknesses in the multiple layer are dimensioned here such that, as regards the gate capacitance, the multiple layer corresponds to a layer made of thermal SiO having a thickness of, for example, 10 nm. For this purpose, layer thicknesses of 4 nm are required for each of the $SiO_2$ layers and a layer thickness of 4 nm is required for the $Si_3N_4$ layer.

If the gate dielectric 8 and the further gate dielectric 12 are formed from a material with a high trap density, then the memory cell configuration is programmed after it has been produced by injecting charge carriers, especially electrons, into the gate dielectric 8 and the further gate dielectric 12. The charge carriers can be introduced by Fowler-Nordheim tunneling or hot electron injection. In this case, the first channel implantation, the second channel implantation and the third channel implantation as well as the resist masks used in these implantations are dispensed with.

With regard to effective leakage current suppression between the memory cells, it is advantageous to use enhancement-mode transistors for the planar MOS transistors and the vertical MOS transistors. In order to realize the information states "one" and "zero", the different threshold voltages are set, for example, at 0.5 volt and 1.5 volt.

We claim:

1. A method of producing a memory cell configuration, which comprises:

etching a plurality of substantially parallel, strip-like trenches with a trench bottom and side walls into a main area of a semiconductor substrate;

forming planar MOS transistors on said trench bottoms and on the main area between adjacent trenches; and forming vertical MOS transistors on the side walls of the trenches.

2. The method according to claim 1, which further comprises:

interconnecting in series the planar MOS transistors on the trench bottom and on the main area between adjacent trenches, respectively;

forming interconnected source/drain regions of adjacent planar MOS transistors as a coherent, doped region;

forming two source/drain regions of each vertical MOS transistor as a coherent region together with one source/drain region of one of the planar MOS transistors on the main area of the substrate and with one of the source/drain regions of the planar MOS transistors on the trench bottom.

3. The method according to claim 1, which further comprises, after forming a gate dielectric for the planar MOS transistors, forming a plurality of first word lines which extend transversely to the trenches and which comprise the gate electrodes of the planar MOS transistors; and carrying out an ion implantation for forming the source/drain regions, and using the first word lines as a mask.

4. The method according to claim 1, which further comprises, after forming a gate dielectric for the vertical MOS transistors, forming second word lines by forming a conductive layer having substantially conformal edge covering and anisotropic back-etching of the conductive layer in each trench, wherein the second word lines are each disposed along a side wall of the trench and comprise the gate electrodes of the vertical MOS transistors along the side wall; and forming an insulation structure for suppressing a formation of conductive channels between adjacent MOS transistors between each two adjacent vertical MOS transistors on the same side wall.

5. The method according to claim 4, which further comprises forming doped regions in a respective side wall for forming an insulation structure.

6. The method according to claim 1, which comprises producing the MOS transistors with mutually different threshold voltages depending on an information content stored therein.

7. The method according to claim 1, which comprises forming a gate dielectric of the MOS transistors from a material including traps.

8. The method according to claim 7, which comprises forming the gate dielectric as a dielectric multiple layer having at least one layer with an increased charge carrier capture cross-section as compared with at least one further layer.

9. The method according to claim 7, which comprises forming the gate dielectric as dielectric layer having impurity atoms incorporated therein, the incorporated impurity atoms having an increased charge carrier capture cross-section as compared with the material of the dielectric layer.

* * * * *